United States Patent
Simonato et al.

(10) Patent No.: US 9,583,540 B2
(45) Date of Patent: Feb. 28, 2017

(54) USE OF SELF-ASSEMBLED LAYERS FOR CHECKING THE THRESHOLD VOLTAGE OF ORGANIC TRANSISTORS

(75) Inventors: Jean-Pierre Simonato, Sassenage (FR); Caroline Celle, Firminy (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 342 days.

(21) Appl. No.: 14/233,949

(22) PCT Filed: Jul. 20, 2012

(86) PCT No.: PCT/IB2012/053720
§ 371 (c)(1),
(2), (4) Date: Jan. 21, 2014

(87) PCT Pub. No.: WO2013/014592
PCT Pub. Date: Jan. 31, 2013

(65) Prior Publication Data
US 2014/0145176 A1    May 29, 2014

(30) Foreign Application Priority Data
Jul. 22, 2011  (FR) ...................................... 11 56684

(51) Int. Cl.
| H01L 29/08 | (2006.01) |
| H01L 51/00 | (2006.01) |
| H01L 27/28 | (2006.01) |
| H01L 51/05 | (2006.01) |

(52) U.S. Cl.
CPC ........ H01L 27/283 (2013.01); H01L 51/0558 (2013.01); H01L 51/0566 (2013.01)

(58) Field of Classification Search
CPC ............................ C08G 61/12; H01L 51/0595
USPC ......................................................... 257/40
See application file for complete search history.

(56) References Cited

U.S. PATENT DOCUMENTS

| 2008/0290337 | A1 | 11/2008 | Halik et al. | |
| 2012/0181538 | A1* | 7/2012 | Kamura | H01L 51/105 257/57 |

FOREIGN PATENT DOCUMENTS

EP   1 496 554 A2   1/2005

OTHER PUBLICATIONS

Cheng Huang "Solution-Porcessed Organic Field-Effect Transistors and Unipolar Inverters Using Self-Assembled Interface Dipoles on Gate Dielectrics" Nov. 20, 2007 American Chemical Society pp. 13223-13231.*
Huang, C., et al.; "*Solution-Processed Organic Field-Effect Transistors and Unipolar Inverters Using Self-Assembled Interface Dipoles on Gate Dielectrics*;" Langmuir, vol. 23, No. 26; pp. 13223-13231; dated 2007.
Kobayashi, S., et al.; "*Control of carrier density by self-assembled monolayers in organic field-effect transistors*;" Nature Materials, vol. 3, No. 5; pp. 317-322; dated 2004; abstract retrieved on Mar. 5, 2014 from <http://www.nature.com/nmat/journal/v3/n5/abs/nmat1105.html>.
Pernstich, K. P., et al.; "*Threshold voltage shift in organic field effect transistors by dipole monolayers on the gate insulator*;" Journal of Applied Physics, vol. 96, No. 11; pp. 6431-6438; dated Dec. 2004.
Wu, Y., et al.; "*Controlled orientation of liquid-crystalline polythiophene semiconductors for high-performance organic thin-film transistors*;" Applied Physics Letters, vol. 86, No. 14; 142102; dated Apr. 2005; abstract retrieved on Mar. 5, 2014 from <http://scitation.aip.org/content/aip/journal/apl/86/14/10.1063/1.1894597>.
International Preliminary Report on Patentability for Application No. PCT/IB2012/053720; dated Jan. 28, 2014.
International Search Report and Written Opinion for Application No. PCT/IB2012/053720; dated Nov. 29, 2012.

* cited by examiner

*Primary Examiner* — David Vu
*Assistant Examiner* — Brandon Fox
(74) *Attorney, Agent, or Firm* — Alston & Bird LLP

(57) ABSTRACT

The invention relates to an electronic device comprising at least two organic transistors having different threshold voltages. The device comprises at least two transistors, each including a self-assembled layer of molecules having dipole moments that differ from one another by an absolute value of between 0.2 and 10 debye. The invention is particularly suitable for use in the field of electronic circuit production.

12 Claims, No Drawings

USE OF SELF-ASSEMBLED LAYERS FOR CHECKING THE THRESHOLD VOLTAGE OF ORGANIC TRANSISTORS

FIELD

The invention relates to an electronic device comprising at least two organic transistors having different threshold voltages as well as a method of fabrication of electronic circuits comprising at least two organic transistors having different threshold voltages.

BACKGROUND

Organic transistor means, in the invention, any device comprising three electrodes (source, drain, gate), and a layer of a dielectric compound separating the gate from a layer of an organic semiconductor material. Organic semiconductor means, in the invention, a compound whose mass is at least 50% based on organic compounds.

A crucial point for making electronic circuits based on organic transistors is control of the threshold voltage of the transistors, i.e. the gate voltage to be applied for generating the transition between the blocked behavior of the transistor and its conducting behavior.

In fact, the threshold voltage of the organic transistor is a key element for making circuits on an industrial scale.

The deposition of layers of organic semiconductors on surfaces having different surface energies is in itself a significant problem. This is all the more true of the crystalline or semicrystalline organic semiconductor materials, for which crystallization is an essential factor for obtaining good performance. Kobayashi et al. in Nature Materials, Vol. 3, May 2004 p 317-322 and Wu et al. in APPLIED PHYSICS LETTERS, 86, 142102 (2005) demonstrated that the use of molecular layers can make it possible to alter the threshold voltage of organic transistors based on amorphous, crystalline or semicrystalline semiconductors. This change in threshold voltage is mainly attributed to the existence of surface charges at the interface of the dielectric material/organic semiconductor material.

Nevertheless, for crystalline or semicrystalline materials, an appreciable change in transistor performance is observed, in addition to the change in threshold voltage. For example, the mobility of the charge carriers varies very significantly. This is attributed to the fact that crystallization takes place differently depending on the surface energies, which vary in relation to the monomolecular layers used. In fact the molecules making up the molecular layers comprise end units which vary, and which therefore induce a different initiation of crystallization.

SUMMARY

With regard to existing technologies and the need to find a solution allowing a set of transistors having the same physical properties to be obtained, with the exception of the threshold voltage, which can be modulated as required, the present invention has the aim of eliminating the problems that exist in the state of the art.

For this purpose, the invention proposes an electronic device comprising a first organic transistor having a threshold voltage $V_1$ and at least one second organic transistor having a threshold voltage $V_2$, $V_1$ and $V_2$ differing from one another by a value of at least 0.2 V, each of the first and at least one second transistors comprising a layer of a semiconductor material on top of a layer of a dielectric material, characterized in that it further comprises:

a first self-assembled layer of molecules having a first dipole moment $M_1$, between the layer of dielectric material and the layer of a semiconductor material of the first organic transistor, and a second self-assembled layer of molecules having a second dipole moment $M_2$ between the layer of a dielectric material and the layer of a semiconductor material of the second organic transistor, the absolute value of the difference between the dipole moment $M_1$ and the dipole moment $M_2$, $|M_1-M_2|$ is between 0.2 and 10 Debye units.

The invention also proposes a method of fabrication of electronic circuits comprising a first organic transistor and at least one second organic transistor, each of the first and of the at least one second organic transistors comprising a layer of a semiconductor material on top of a layer of a dielectric material, characterized in that it comprises the following steps:

a) forming, on the layer of a dielectric material of the first transistor, a self-assembled layer from molecules having a dipole moment $M_1$, and b) forming, on the layer of a dielectric material of the at least one second organic transistor, a self-assembled layer from molecules having a dipole moment $M_2$ such that the absolute value $|M_1-M_2|$ is between 0.2 and 10 Debye units.

DETAILED DESCRIPTION

Preferably, the molecules from which the self-assembled layers of the first and of the at least one second organic transistors have the following formula I:

$$A\text{-}D\text{-}Z \qquad \text{Formula I}$$

in which:

A is a grafted group of the molecule of formula I on the dielectric material, preferably a trihalogenosilane group, trialkoxysilane, carboxylic acid, phosphoric acid, an unsaturated compound, preferably comprising a vinyl or acetylene group, a diazonium salt, a nitride, a radical initiator compound, an isocyanate, a group of the organolithium, organomagnesium, or organozinc type, or a sulfonic acid, Z is an end group comprising from 3 to 8 carbon atoms, linear or branched or aromatic, optionally comprising at least one fluorine atom, D is a linear or branched, saturated or unsaturated carbon chain, optionally comprising a cyclic group, optionally aromatic, and/or several heteroatoms, the difference between the value of the water contact angle of the self-assembled layer of the first organic transistor and the value of the water contact angle of the self-assembled layer of the at least one second organic transistor is less than 5%, preferably less than 3%.

In a first preferred embodiment of the method of the invention, the dielectric material of the first and at least one second transistor is based on silicon, alumina or surface-oxidized polymer, and the grafted group A of the molecules of formula I is a trihalogenosilane or ($C_1$ to $C_4$) trialkoxysilane group, preferably a trimethoxysilane, trichlorosilane or triethoxysilane group.

Preferably, in formula I, group D comprises an aromatic nucleus, optionally substituted.

Still preferably, the end group Z in the compounds of formula I is selected from a linear or branched, saturated or unsaturated $C_3$ to $C_8$ alkyl group, optionally comprising a fluorine atom and/or an aromatic group. Z is preferably selected from a tert-butyl, isopropyl, adamantyl, perfluoroethyl or benzyl or butyl group.

More preferably, the molecules of formula I from which the self-assembled layers of the transistors are formed have the following formula I':

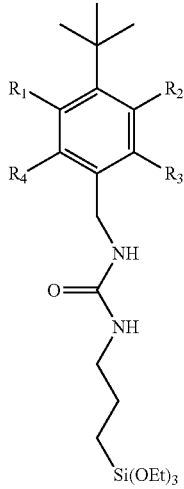

Formula I' in which $R_1$, $R_2$, $R_3$ and $R_4$ represent, independently of one another, electron-accepting or electron-donating groups.

Preferably, the groups $R_1$, $R_2$, $R_3$ and $R_4$ in formula I' are selected, independently of one another, from a hydrogen atom, a substituted or unsubstituted $C_1$-$C_{10}$ alkyl group, a halogen atom, a nitro group (—$NO_2$), ester, amide, trifluoromethyl, dialkylamide, alkoxy, cyano, aldehyde, ketone, carboxylic acid (—COOH) or amine (—$NH_2$).

Most preferably, the molecules of formula I from which the self-assembled layers of the transistors are formed are selected from the molecules of the following formulas L, M and N:

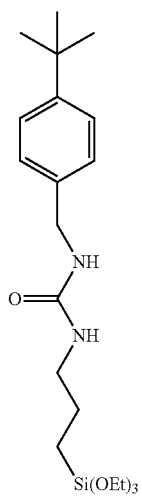

Formula L

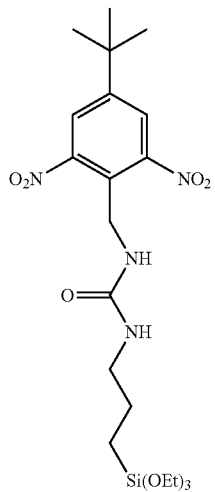

Formula M

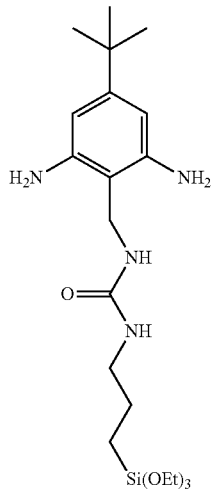

Formula N

These molecules have the formula I' in which, for formula L, $R_1$, $R_2$, $R_3$ and $R_4$ are H, for formula M, $R_1$ and $R_2$ are H and $R_3$ and $R_4$ are —$NO_2$, and for formula N, $R_1$ and $R_2$ are H and $R_3$ and $R_4$ are —$NH_2$.

The invention will be better understood and other features and advantages of the invention will become clearer on reading the explanatory description given hereunder.

The invention proposes a method of fabrication of electronic circuits comprising at least two organic transistors, each of these organic transistors comprising a layer of one and the same semiconductor material or of semiconductor materials that are different but deposited on a dielectric material which is itself modified at various places with self-assembled molecular layers that are different in the first and at least one second organic transistor.

Organic semiconductor material means, in the invention, a compound whose mass is at least 50% based on organic compounds. The latter include the amorphous, semicrystalline or crystalline semiconductors, of type p or n. Examples of organic semiconductor compounds are pentacene, the pentacene derivatives such as anthrathiophene, anthradithiophene or triethylsilylethynyl-anthradithiophene, the polyalkylthiophenes and derivatives thereof known by the names P3HT, PQT12, F8T2, P3OT, the diimides of naphthalenes and perylenes (where the structures based on naphthalenes and perylenes can optionally be modified and/or substituted), the polytriarylamines and derivatives thereof, the copper phthalocyanines, etc.

The molecules from which the various self-assembled molecular layers are formed on the layer of a dielectric material of each of the transistors belong to the same family of molecules. They all have a covalent bonding function for grafting the molecule on the dielectric material (group A in formula I) or constituting the gate of the transistors and have a different dipole moment intrinsic to the chemical structure of each molecule (more precisely group D+Z in formula I) but one and the same surface energy when they are assembled as a molecular layer. This same surface energy is obtained because all the molecules of this family possess identical or similar terminal functions (group Z in formula I). The self-assembled layers obtained from these molecules have a difference between them in values of water contact angle less than 5%, preferably less than 3%.

The molecules used to form each molecular layer at the interface between the layer of semiconductor material and the layer of dielectric material are families of molecules of the following formula I:

A-D-Z  formula I

In these molecules, group A is a reactive group that allows grafting by one or more covalent bonds on the layer of dielectric material. This group can be a trihalogenosilane group, trialkoxysilane, carboxylic acid, phosphoric acid or sulfonic acid, an unsaturated group, for example of the vinyl or acetylene type, a diazonium salt or a derivative of diazonium salt, a nitride group, a radical initiator group, an isocyanate group or an isocyanate derivative, or else of the organolithium, organomagnesium, or organozinc type.

In the molecules of formula I, D is the central part of the molecule. The structure of this central part D is modified in such a way that the molecular layers obtained from these molecules on the various layers of dielectric material possess a specific dipole moment.

Preferably, the central parts D of the molecules of formula I will be composed of a substituted aromatic nucleus, the substituents of which induce varied dipole moments.

Thus, for fabricating electronic circuits comprising a first organic transistor and a second organic transistor, a first type of molecules of formula I will be used having a dipole moment $M_1$ and a second type of molecules of formula I having a dipole moment $M_2$ such that the absolute value of the difference between these dipole moments $M_1$ and $M_2$ is between 0.2 and 10 Debye units.

When the electronic circuit comprises three organic transistors, three types of molecules of formula I will be used for forming three self-assembled layers on each of the respective layers of a dielectric material of each of the transistors. In this case, the difference between the dipole moments of the three assemblies (D+Z) of each molecule of formula I will be of at least 0.2 Debye unit.

The group Z in the molecules of formula I is the end group of the molecule of formula I. A family of molecules of formula I will possess the same terminal function or a terminal function such that the surface energy measured on a self-assembled layer made from this family of molecules is similar (i.e. having a contact angle with values with dispersion of less than 5%). Preferably the end group is an alkyl group, optionally fluorinated, or an aromatic group, generating an almost identical surface energy.

For example, an alkyl group, a fluorinated group and an aromatic group are of different natures but generate an almost identical surface energy. This group is composed of at least 3 carbon atoms and comprises at most 8 carbon atoms.

In a preferred embodiment, this end group Z is selected from a tert-butyl, isopropyl, adamantyl, perfluoroethyl, benzyl or butyl group.

The molecules that will be used to form the various self-assembled layers must form self-assembled layers having a difference between them in the value of the water contact angle less than 5%, preferably less than 3%. Thus, when two different molecules of formula I are used, the difference in the measurement of their water contact angle of the self-assembled layers formed must be less than 5%, preferably less than 3%. The same applies when three molecules are used, if the first molecule leads to a self-assembled layer having a value of water contact angle $x_1$, the other two molecules must lead to self-assembled layers having a difference in value of water contact angle, relative to this value less than 5%, preferably less than 3% and also have between them a difference in value of water contact angle less than 5%, preferably less than 3%.

Thus, the dipole moment of the first molecule, designated $M_1$, and the dipole moment of the second molecule, designated $M_2$, and the dipole moment of the third molecule, designated $M_3$, must be such that the absolute values $|M_1-M_2|$ and $|M_1-M_3|$ and $|M_2-M_3|$ are greater than or equal to 0.2 Debye unit.

The dipole moments of parts (D+Z) of the molecules of formula I are measured by the semi-empirical method PM3 with the MOPAC® software version 2009.

The water contact angle is measured by the classical method using a camera and a goniometer.

In a preferred embodiment, the molecules are of the same family with a terminal function Z that is a tert-butyl group but differ by their central parts D, which possess different dipole moments because of the groups present on the chain constituting the central parts D.

A preferred family of such molecules are the molecules of the following formula I':

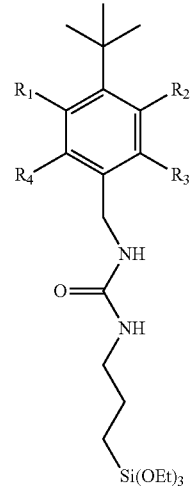

Formula I' in which $R_1$, $R_2$, $R_3$ and $R_4$ are selected, independently of one another, from electron-accepting or electron-donating groups.

Preferably, the groups $R_1$, $R_2$, $R_3$ and $R_4$ of formula I' are selected from a hydrogen atom, a substituted or unsubstituted $C_1$-$C_{10}$ alkyl group, a halogen atom, a nitro group (—$NO_2$), ester, amide, trichloromethyl, dialkylamine, alkoxy, cyano, aldehyde, ketone, carboxylic acid (—COOH), or amine (—$NH_2$).

In formula I', and referring to formula I, Z is a tert-butyl group and A is a triethoxysilane group.

The preferred molecules of formula I and of formula I' are the following molecules of formulas L, M and N:

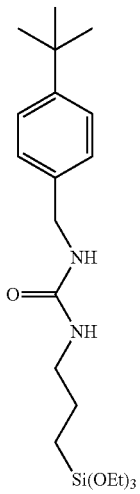

Formula L

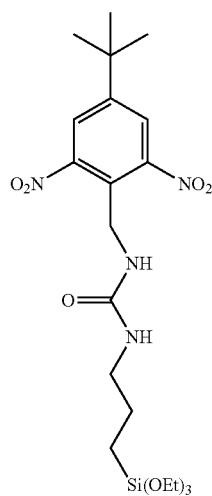

Formula M

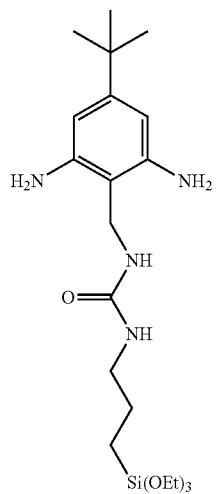

Formula N

EXAMPLE

The molecules of the following formulas L, M and N:

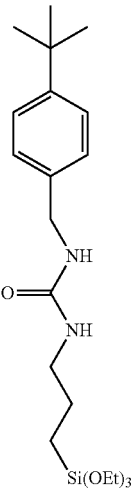

Formula L

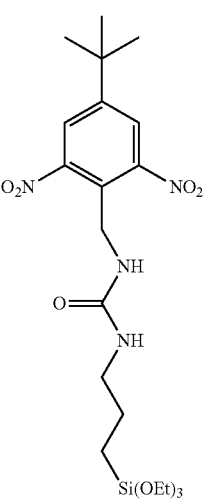

Formula M

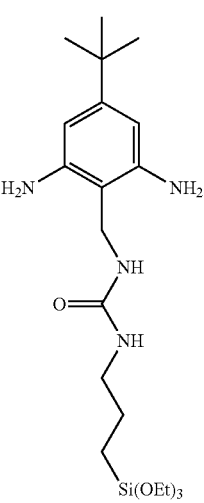

Formula N are synthesized and purified, then grafted independently on electrical devices. These electrical devices were fabricated on a silicon substrate coated with a layer of silicon oxide with a thickness of 100 nm. Ti/Au electrodes (5/30 nm) were deposited by evaporation on the silicon oxide (silica) surface, which constitutes the insulating dielectric material of the electrical device according to the invention. The surface of the layer of silicon oxide is activated by a plasma-oxygen treatment (20 mTorr, 10 sccm $O_2$, 10 W, 300 s) to create surface hydroxyl functions. The surface is then functionalized by immersion at room temperature for 24 hours in a 1 mM solution of compound of formula L, of formula M or of formula N, in toluene. The substrate is then rinsed abundantly with dichloromethane, water and acetone and then dried under an argon stream. The water contact angles of the surfaces obtained from the molecules of formulas L, M and N are measured at 78°, 76° and 75° respectively. The dipole moment, calculated on the part "D+Z" of the molecule of formula L is of 0.2 Debye unit, that calculated on the part "D+Z" of the molecule of formula M is of 0.2 Debye unit and that calculated on the part "D+Z" of the molecule of formula N is of −1.7 Debye units.

A crystalline type semiconductor, pentacene, is then deposited by evaporation on each device to form a transistor. The electrical performance measured between the three transistors is similar, with the exception of the threshold voltage, which is −0.5 V for the transistor made with the molecule of formula L, +19.5 V for the transistor made with the molecule of formula M and −9.0 V for the transistor made with the molecule of formula N. Apart from this variation in threshold voltage, the performance is similar for the transistors, and notably the mobility, which, for the three devices, is measured between $1\times10^{-2}$ and $3\times10^{-2}$ $cm^2 \cdot V^{-1} \cdot s^{-1}$.

Without functionalization with one of the molecules of formula L, of formula M or of formula N, the same transistor as synthesized above has a threshold voltage of −7.0 V.

Thus, it can be seen that with the molecules of formula I, the threshold voltage of a transistor can be adjusted at will without changing its other electrical properties and performance.

The molecules L, M or N can also be grafted on two transistors placed on one and the same support, using a mask and successive or localized deposition by liquid jet, screen printing, etc.

Of course, the number of transistors in the electronic device of the invention can be greater than 2, provided that the dipole moments of each of the molecules used for making the self-assembled layers of the different transistors differ by 0.2 to 10 Debye units.

The invention is of considerable industrial and scientific importance since circuits based on organic transistors have numerous applications in organic electronics, and can be obtained at low cost on large surfaces and on flexible surfaces.

The invention claimed is:

1. An electronic device comprising a first organic transistor having a threshold voltage $V_1$ and at least one second organic transistor having a threshold voltage $V_2$, $V_1$ and $V_2$ differing from one another by a value of at least 0.2 V, each of the first and second transistors comprising a layer of a semiconductor material, on top of a layer of a dielectric material, wherein the device further comprises:
   a first self-assembled layer of molecules having a first dipole moment $M_1$, between the layer of dielectric material and the layer of a semiconductor material of the first organic transistor, and
   a second self-assembled layer of molecules having a second dipole moment $M_2$, between the layer of a dielectric material and the layer of a semiconductor material of the second organic transistor, and in that
   the absolute value of the difference between the dipole moment $M_1$ and the dipole moment $M_2$, $|M_1-M_2|$, is between 0.2 and 10 Debye units.

2. A method of fabrication of an electronic circuit comprising a first organic transistor and at least one second organic transistor, each of the first and of the at least one second organic transistors comprising a layer of a semiconductor material on top of a layer of a dielectric material, wherein the method comprises the following steps:
   a) forming, on the layer of a dielectric material of the first transistor, a self-assembled layer formed from molecules having a dipole moment $M_1$, and
   b) a step of forming, on the layer of a dielectric material of at least one second organic transistor, a self-assembled layer formed from molecules having a dipole moment $M_2$, such that the absolute value, $|M_1-M_2|$, is between 0.2 and 10 Debye units.

3. The method as claimed in claim 2, wherein
   the molecules from which the self-assembled layers of the first and of the at least one second organic transistors have the following formula I:

A-D-Z   Formula I in which:
   A is a grafted group of the molecule of formula I on the dielectric material comprising one or more of a trihalogenosilane group, trialkoxysilane, carboxylic acid, phosphoric acid, an unsaturated group, comprising a vinyl or acetylene group, a diazonium salt, a nitride, a radical initiator compound, an isocyanate, a group of the organolithium, organomagnesium, or organozinc type, or sulfonic acid,
   Z is an end group comprising 3 to 8 carbon atoms, linear or branched or aromatic, optionally comprising at least one fluorine atom,
   D is a linear or branched, saturated or unsaturated carbon chain, optionally comprising a cyclic group, optionally aromatic and/or several heteroatoms,
   and in that
   the difference between the value of water contact angle of the self-assembled layer of the first organic transistor and the value of the water contact angle of the self-assembled layer of the at least one second organic transistor is less than 5%.

4. The method as claimed in claim 2, wherein the dielectric material of the first and at least one second transistors is of silica, alumina or a surface-oxidized polymer, and in that the grafted group A of the molecules of formula I is a trihalogenosilane or ($C_1$ to $C_4$) trialkoxysilane group.

5. The method as claimed in claim 2, wherein the group D comprises an optionally substituted aromatic nucleus.

6. The method as claimed in claim 2, wherein the end group Z in the compounds of formula I is selected from an aromatic group and/or a saturated or unsaturated, linear or branched $C_3$ to $C_8$ alkyl group, optionally comprising a fluorine atom, Z is selected from a tert-butyl, isopropyl, adamantyl, perfluoroethyl, benzyl or butyl group.

7. The method as claimed in claim 2, wherein the molecules of formula I from which the self-assembled layers of the transistors are formed have the following formula I':

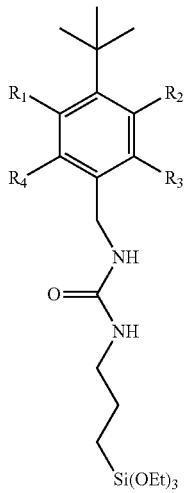

Formula I'

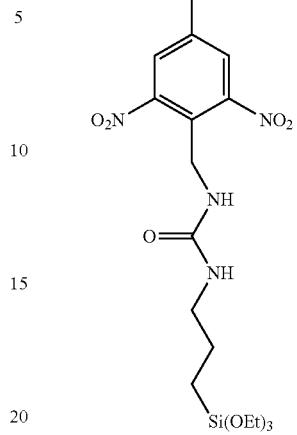

Formula M in which $R_1$, $R_2$, $R_3$ and $R_4$ are selected independently of one another from electron-accepting or electron-donating groups.

8. The method as claimed in claim 7, wherein the groups $R_1$, $R_2$, $R_3$ and $R_4$ are selected, each independently of one another, from a hydrogen atom, a substituted or unsubstituted $C_1$-$C_{10}$ alkyl group, a halogen atom, a nitro group (—$NO_2$), ester, amide, trichloromethyl, dialkylamine, alkoxy, cyano, aldehyde, ketone, carboxylic acid (—COOH) or amine (—$NH_2$).

9. The method as claimed in claim 2, wherein the molecules of formula I from which the self-assembled layers of the transistors are formed are selected from the molecules with the following formula L, formula M and formula N:

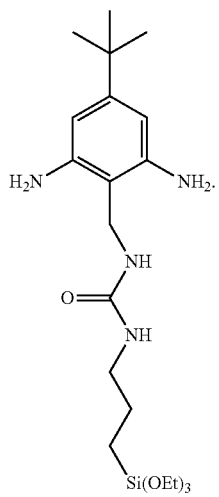

Formula N

Formula L

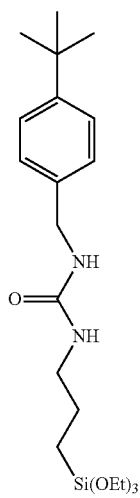

10. The method as claimed in claim 7, wherein the groups $R_1$, $R_2$, $R_3$ and $R_4$ are selected, each independently of one another, from a hydrogen atom, a nitro group and an amine group.

11. The method as claimed in claim 2, wherein the difference between the value of water contact angle of the self-assembled layer of the first organic transistor and the value of the water contact angle of the self-assembled layer of the at least one second organic transistor is less than 3%.

12. The method as claimed in claim 2, wherein the dielectric material of the first and at least one second transistors is of silica, alumina or a surface-oxidized polymer, and in that the grafted group A of the molecules of formula I is a trimethoxysilane, trichlorosilane or triethoxysilane group.

* * * * *